(12) United States Patent
Tzu et al.

(10) Patent No.: US 6,190,809 B1
(45) Date of Patent: Feb. 20, 2001

(54) COST-EFFECTIVE METHOD TO FABRICATE A COMBINED ATTENUATED-ALTERNATING PHASE SHIFT MASK

(75) Inventors: San-De Tzu, Taipei; Ching-Shiun Chiu, Kaohsiung; Wei-Zen Chou, Taipei, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/421,518

(22) Filed: Oct. 20, 1999

(51) Int. Cl.[7] ................. G03F 9/00; G03C 5/00
(52) U.S. Cl. ................. 430/5; 430/394
(58) Field of Search ................. 430/5, 322, 323, 430/324, 394

(56) References Cited

U.S. PATENT DOCUMENTS

| | | | |
|---|---|---|---|
| 5,472,814 | 12/1995 | Lin | 430/5 |
| 5,523,186 | 6/1996 | Lin et al. | 430/5 |
| 5,565,286 | 10/1996 | Lin | 430/5 |
| 5,783,337 | 7/1998 | Tzu et al. | 430/5 |
| 5,882,827 | * 3/1999 | Nakao | 430/5 |

OTHER PUBLICATIONS

Chang et al., "ULSI Technology", the McGraw–Hill Companies, Inc., New York, NY, (1996), pp. 284–288.

* cited by examiner

Primary Examiner—S. Rosasco
(74) Attorney, Agent, or Firm—George O. Saile; Stephen B. Ackerman

(57) ABSTRACT

A mask combining an alternating phase shift part and an attenuating phase shift part on a single blank and a method of forming said mask. The method involves fewer processing steps, fewer layers of material and is more cost effective than other methods in the current art. A central reason for the simplicity of the method is the use of different intensity levels of E-beam exposure in a single resist layer and achieving phase shifts by transmitting radiation through alternating regions of the same transparent substrate that are etched and not etched.

42 Claims, 6 Drawing Sheets

COST-EFFECTIVE METHOD TO FABRICATE A COMBINED ATTENUATED-ALTERNATING PHASE SHIFT MASK

BACKGROUND OF THE INVENTION

1. Field of the Invention

The present invention is a mask and a process for fabricating that mask. More specifically, it is a mask that combines the properties of an attenuated phase shifting mask (Att PSM) and an alternating phase shifting mask (Alt PSM). The method of fabrication achieves simplicity and cost-effectiveness by combining different intensities of electron-beam developing in a single resist medium.

2. Description of the Related Art

As structural dimensions in microelectronic circuitry become increasingly small, lithographic processes that image the circuit design on semiconductor substrates are called upon to resolve details of 0.35 microns and less. The use of optical lithography in this resolution regime is severely limited by diffraction effects caused by the small openings in the masks which are used to transfer circuit patterns by optical imaging. Diffraction of the transmitted light blurs the edges of small isolated structures and severely limits the ability to resolve spacings between densely packed and closely neighboring structures. Two new technologies have emerged that significantly improve the resolution of the masks used in optical lithography: alternating phase shifting (Alt PSM) and attenuated phase shifting (Att PSM). The concept of phase shifting is central to both technologies. Phase shifting is the translation of an electromagnetic sinusoid by a given angle (the phase angle) relative to a reference wave. When a shifted and un-shifted wave combine on a common image plane, the resulting superposition can produce constructive or destructive interference in the fields depending on the size of the phase shift and concurrent increases or decreases in the field intensities. If the un-shifted wave produces a diffraction pattern by passing through a small aperture in a mask, the unwanted diffraction lobes on either side of the central maximum can be significantly reduced by also passing the wave through an adjacent aperture that is filled with a transparent medium fabricated so as to shift the phase by 180 degrees ($\pi$ radians). A series of adjacent apertures, with alternate apertures filled with a phase shifting medium, forms what is called an alternating phase shifting mask (Alt PSM). Such masks are discussed in C. Y. Chang and S. M. Sze, "ULSI Technology," McGraw-Hill Co., N.Y. 1996, pp 284–288. The construction of a mask by combining alternating phase shifted and non-phase shifted structures for bi-directional circuit patterns is discussed by Lin in U.S. Pat. No. 5,472,814, 1995. The application of combined alternating phase shift masks to the reproduction of complex circuit patterns is also discussed by Lin et al in U.S. Pat. No. 5,523,186, 1996.

A second technology utilizing the properties of combined shifted and un-shifted electromagnetic radiation, is the attenuated phase shift mask (Att PSM). This design surrounds an isolated opening in a mask with a material such as molybdinum silicide oxynitride (MoSiON) that both phase shifts and attenuates the transmitted radiation on either side of the opening, only where the unwanted diffraction lobes of the non-phase shifted radiation appear. This combination does not affect the central maximum that delineates the opening, but it significantly reduces the intensity of the diffraction lobes on either side. This has the effect of sharpening the image of the opening. The attenuated phase shift mask is discussed by Tzu et al, U.S. Pat. No. 5,783,337, 1998.

The Alt PSM technology is effective for improving the resolution of repetitive, closely packed structures, but it provides no benefits when applied to isolated structures. Conversely, the Att PSM technology improves the resolution of small, isolated structures, but offers no advantages where closely packed structures are involved.

A way of achieving the improved resolution benefits of phase shifting in its various forms where the circuit design to be imaged has both densely packed and isolated structures, is to combine the alternating and attenuated phase shifting technologies on the same mask. This is the approach taken by Lin et al in U.S. Pat. No. 5,565,286, 1996. Although this combination of technologies is an excellent way to produce high resolution images of complex circuit designs having a variety of structural forms, the fabrication of such a mask involves a large number of separate processing steps as well as a multiplicity of materials, both leading to increased production time and cost. The method of Lin et al (U.S. Pat. No. 5,565,286) cited above, for example, employs separate and multiple layers of different material to act as phase shifters and attenuators of different transmissivities, so that the completed fabrication has as many as five layers of active material. A more cost-effective fabrication process for a combined Alt PSM and Att PSM on the same mask would be of great benefit and is the subject of the invention described herein.

SUMMARY OF THE INVENTION

This invention is a mask combining both alternating and attenuating phase shift elements and a simplified, cost-effective method for fabricating said mask. Such a mask will improve the resolution of both densely packed and isolated structures in complex circuit designs.

A first object of the present invention is to provide a method for forming a mask having both alternating and attenuating phase shifting structures on the same mask substrate.

A second object of the present invention is to provide a method for forming such a mask that minimizes the number of processing steps and the number of material layers.

A third object of the present invention is to provide such a mask that combines both alternating and attenuating phase shifting structures and will improve the resolution of both densely packed and isolated structures in complex circuit designs.

These objects are achieved by providing a mask blank comprised of a transparent substrate over which are successively deposited an attenuating absorbing layer, an opaque layer and a resist layer that can be developed following electron beam (E-beam) exposure. The resist layer is exposed to two different depositions of E-beam energy, the higher one for isolated and densely packed circuit structures, the lower one for the rim of attenuated patterns. After development and baking, different resist step heights have been created. The main pattern is then transferred to the opaque layer and attenuating layer by dry etching. An oxygen plasma having high selectivity and anisotropy is then used to dry etch the different resist thicknesses to expose the attenuator patterns. The opaque layer that still exists above the attenuator pattern is then removed by a dry etch. Stripping the remaining resist layer completes the processes and leaves the completed combination of alternating and attenuating phase shift structures. A key element of the simplicity of this design is the use of the optically transparent substrate to provide the necessary phase shifting by means of etched regions alternating with unetched regions.

BRIEF DESCRIPTION OF THE DRAWINGS

FIG. 13 is the side view of the completed mask, as depicted from above in FIG. 1.

FIG. 2 shows the mask blank, consisting of a transparent substrate over which there are successively applied absorbing, opaque and resist layers.

FIG. 3 shows the resist after two depositions of E-beam energy.

FIG. 4 shows the voids created in the resist after developing and baking.

FIG. 5 shows the mask after dry etching through the attenuating and opaque layers.

FIG. 6 shows the mask after the resist layer has been reduced by the oxygen plasma.

FIG. 7 shows the mask after removal of the opaque layer by a dry etch. The dry etch leaves the attenuating layer in place.

FIG. 8 shows the mask after removal of the remaining resist layer.

FIG. 9 shows the mask covered with a second resist layer.

FIG. 10 shows the second resist layer after exposure to E-beam energy over the position of the alternate slits.

FIG. 11 shows the removal of the developed resist layer.

FIG. 12 shows the result of dry etching the transparent substrate.

FIG. 13 shows the mask with the resist stripped away. The original thickness of the transparent substrate relative to the more deeply etched regions provides the necessary 180 degree phase shifting in both parts of the mask.

FIG. 14 shows the prepared blank of FIG. 2 after exposure of the resist layer to three intensities of E-beam energy.

FIG. 15 shows the mask after developing the resist and etching of the opaque layer and attenuating layer.

FIG. 16 shows the mask after dry etching of the transparent substrate.

FIG. 17 shows the mask after etching by the oxygen plasma.

FIG. 13 is the final configuration of the mask after etching the remaining exposed opaque layer and removing the remaining resist layer.

DESCRIPTION OF THE PREFERRED EMBODIMENTS

Figure 1:
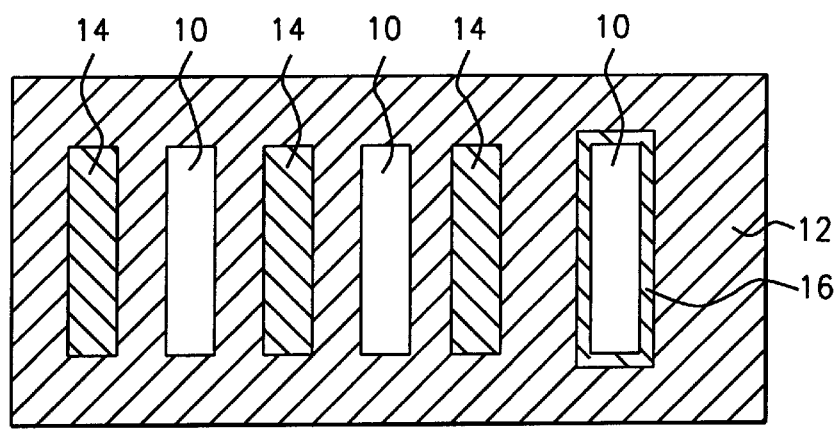
FIG. 1 shows a view from above of a completed mask combining an alternating phase shift structure of five parallel rectangular openings and an attenuating phase shift structure consisting of a single, isolated rectangular opening.

The present invention is a mask combining an alternating phase shift portion and an attenuating phase shift portion and a method for forming that mask. A first preferred embodiment will be described by referring to a series of figures labeled FIG. 1 through FIG. 13. Referring now to FIG. 1, there is shown an overhead view of a simple example of such a mask, combining a single set of five parallel, closely spaced rectangular openings forming the alternating phase shift portion of the mask, together with a single isolated rectangular opening, forming the attenuating phase shift portion of the mask. The three rectangles (14) are phase shifted by 180 degrees relative to the two rectangles (10). The nearby attenuating structure has a transparent central portion (10) surrounded at its rim by an attenuating and phase shifting annulus (16). All other portions of the mask are optically opaque (12).

Figure 2:
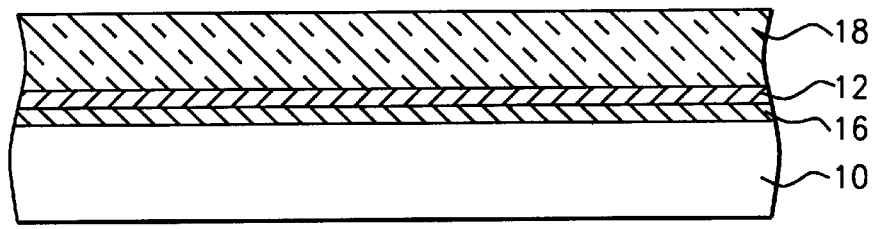
FIG. 2, FIG. 3, FIG. 4, FIG. 5, FIG. 6, FIG. 7, FIG. 8, FIG. 9, FIG. 10, FIG. 11, FIG. 12 and FIG. 13, are side views depicting the processes by which the mask of FIG. 1 is fabricated, according to a first preferred embodiment of this invention.

FIG. 2 shows a side schematic view of a mask blank, which serves as the starting configuration for the fabrication of the mask. The blank consists of a transparent substrate (10), which may be quartz, which will ultimately serve as both a phase shifting medium and a non-phase shifting medium. A layer of attenuating material (16) has been deposited on the substrate. The attenuating material may be the optically attenuating material MoSiON deposited to a thickness of between about 800 angstroms and 1100 angstroms.

A layer of opaque material (12), which may be chromium, is deposited on the layer of attenuating material to a depth of between approximately 700 angstroms and 1000 angstroms. A layer of E-beam sensitive resist (18) is deposited on the opaque layer, to a thickness of between 5000 angstroms and 7000 angstroms.

Figure 3:
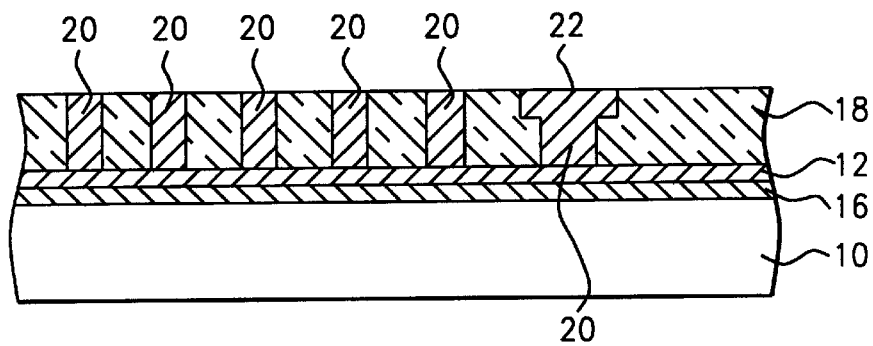

FIG. 3 shows the mask blank after two depositions of 50 kev E-beam energy to the resist layer. The more deeply penetrating deposition (20), of approximately 27 $\mu C/cm^2$, penetrates to the opaque layer (12). The less deeply penetrating deposition, of approximately 7 $\mu C/cm^2$ forms a shallow region (22).

Figure 4:
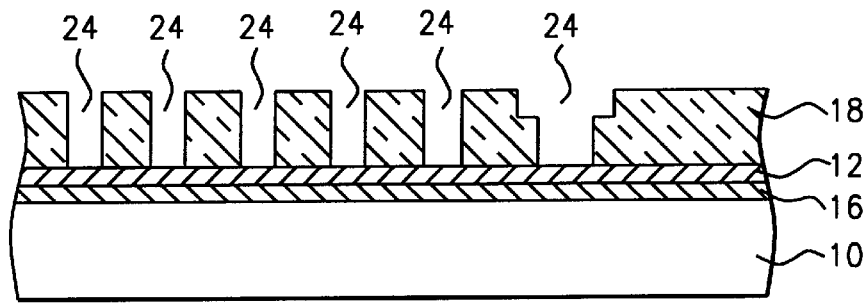

FIG. 4 shows the exposed areas of the resist having been removed (20), (22) after developing and baking.

Figure 5:
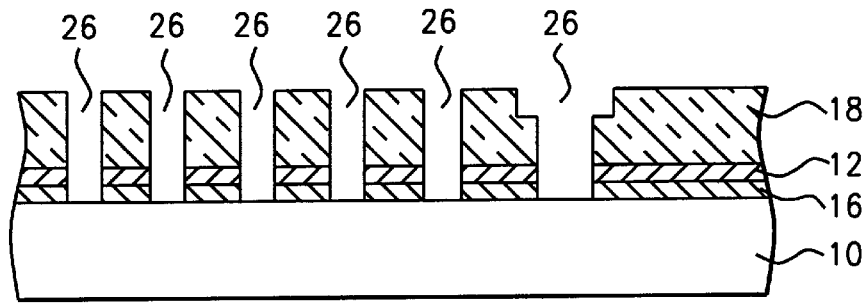

FIG. 5 shows the condition of the mask after being subjected to a dry etch of the exposed opaque layer (12). This etch also removes the attenuating layer (16) immediately below the opaque layer, leaving rectangular openings (26) that terminate at the surface of the transparent substrate (10).

Figure 6:
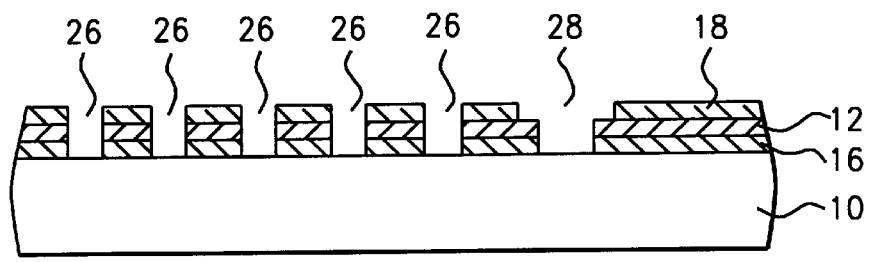

FIG. 6 shows the results of applying a highly selective and anisotropic oxygen plasma to the surface of the resist in its condition as indicated in FIG. 5. The plasma selectively etches down the shallow rim region (28) to expose the opaque layer (12) beneath it.

Figure 7:
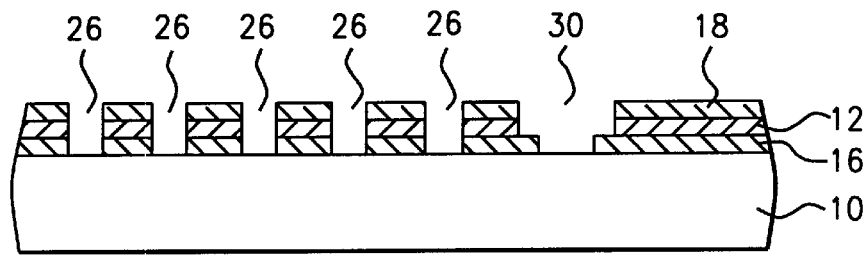

FIG. 7 shows the results of etching away the opaque layer (12), exposed by the plasma etch of the previous figure. The resulting opening (30), now has an exposed layer of attenuating material (16) surrounding its rim.

Figure 8:
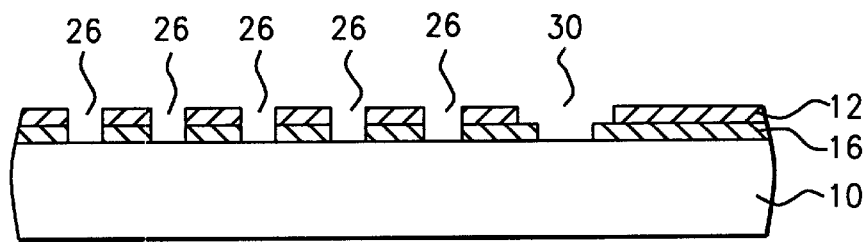

FIG. 8 shows the mask after the remaining resist layer (18) is removed.

Figure 9:
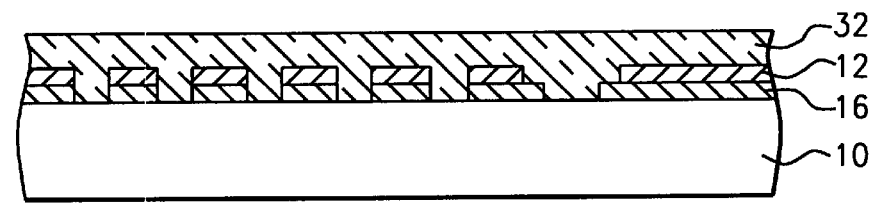

FIG. 9 shows a second resist layer now having been deposited on the mask just illustrated in FIG. 8.

Figure 10:
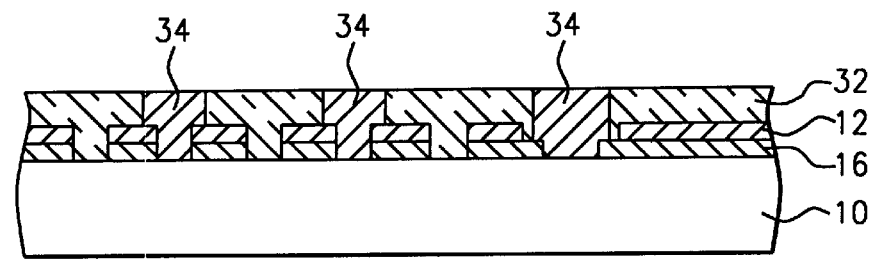

FIG. 10 shows this resist layer exposed by a 50 kev E-beam at a deposition intensity of 27 $\mu C/cm^2$. The exposed regions (34) will ultimately form the non-phase shifting portions of the transparent substrate (10).

Figure 11:
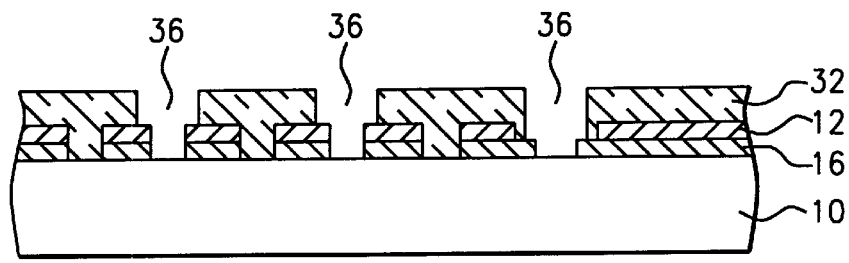

FIG. 11 illustrates the result of developing and baking the E-beam exposed regions of the resist layer to expose the surface of the transparent substrate below (36).

Figure 12:
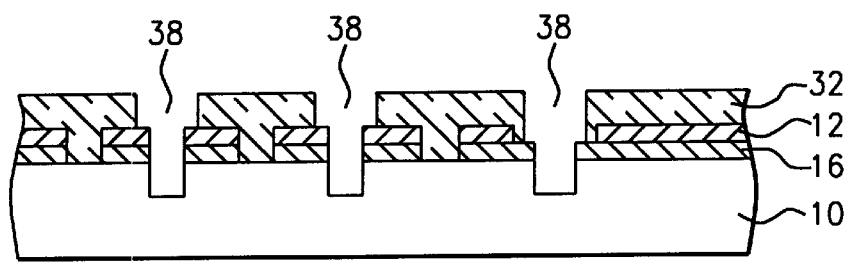

FIG. 12 shows the results of subjecting the three exposed regions of the transparent substrate to a dry etch to a depth of approximately 2700 angstroms below the surface of the substrate (38). Light passing through the optically transparent substrate at its original thickness will acquire a phase shift of 180 degrees relative to the light that passes through the thinner, etched regions of the substrate. The depth of etch is determined by the difference in optical pathlengths required to produce a 180 degree phase shift in the transmitted light.

Figure 13:
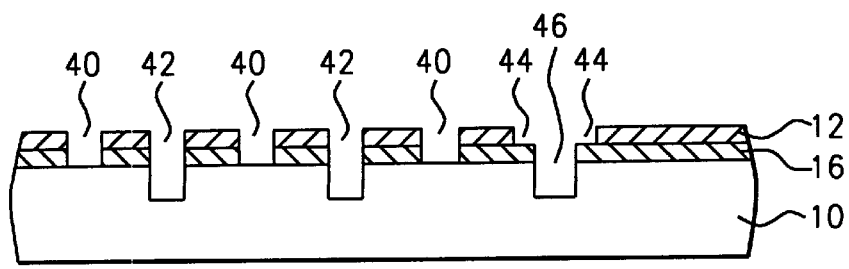

FIG. 13 shows the finished mask, the remaining resist layer having been removed. The side view of the mask in FIG. 13 corresponds exactly to the top view of FIG. 1.

A second preferred embodiment of the present invention will be explained by reference to FIG. 1, FIG. 2, FIG. 14 through FIG. 17 and FIG. 13. FIG. 1, again, shows an overhead view of the mask to be fabricated and FIG. 13, shows the side view of the same mask, now having been fabricated according to the processes depicted in FIG. 14 through FIG. 17, according to a second preferred embodiment. FIG. 2 shows the same mask blank used in the first preferred embodiment, now being used as the starting point for the second preferred embodiment.

Figure 14:
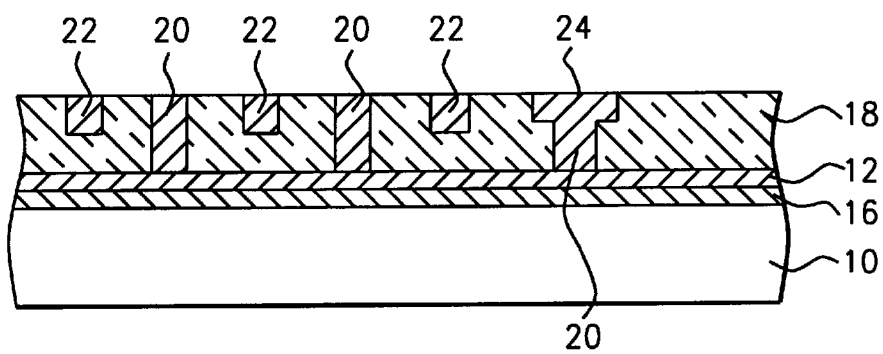
FIG. 14, FIG. 15, FIG. 16 and FIG. 17 are side views depicting the processes by which the mask of FIG. 1 is fabricated, according to a second preferred embodiment of the present invention.

Referring now to FIG. 14, we see the results of exposing the resist layer (12) to three different exposure depositions of 50 kev E-beam energy. The highest amount, approximately 27 $\mu C/cm^2$, produces the three deepest exposure depths (20). The intermediate E-beam deposition amount, approximately 10 $\mu C/cm^2$, produces three intermediate depth exposures (22). The lowest E-beam deposition amount, approximately 7 $\mu C/cm^2$, is used to create the rim (24).

Figure 15:
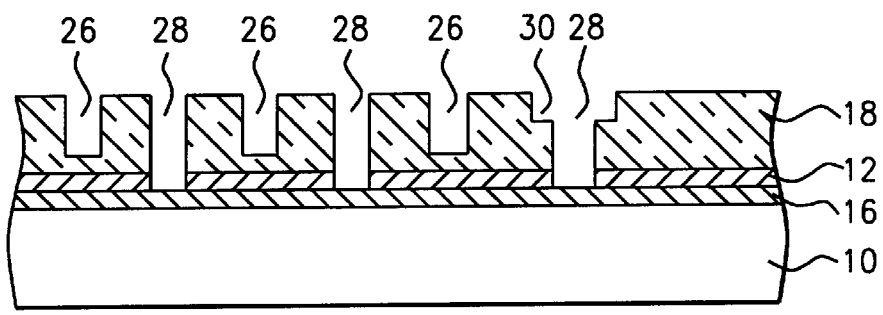

FIG. 15 shows the openings (26), (28), (30) produced by developing and baking the exposed resist layer and the result of etching away the opaque layer (12) exposed by the deepest of those openings (28).

Figure 16:
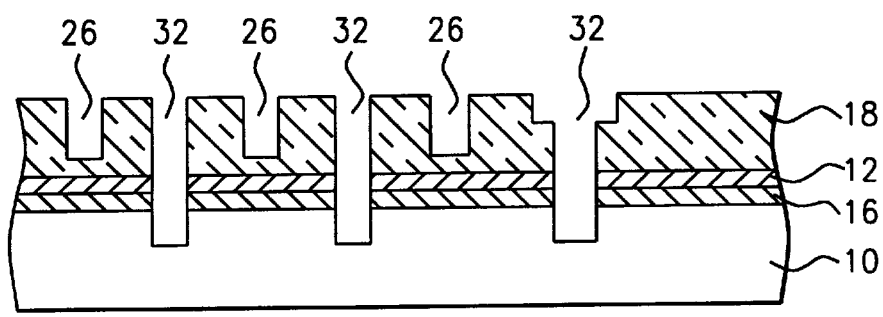

FIG. 16 shows the results of a dry etch of the transparent substrate (10) beneath the openings (28) to a depth of 2700 angstroms, that will ultimately define the regions transmitting light that is not phase shifted.

Figure 17:
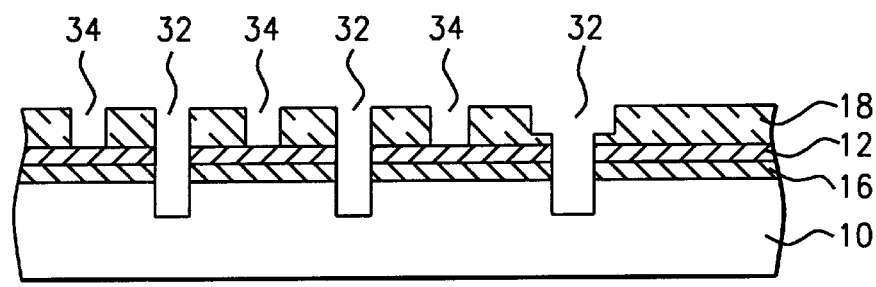

FIG. 17 shows the results of applying a selective, anisotropic oxygen plasma etch to the resist layer (18). The intermediate depth openings (34) are etched back to expose the opaque layer.

Figure 18:
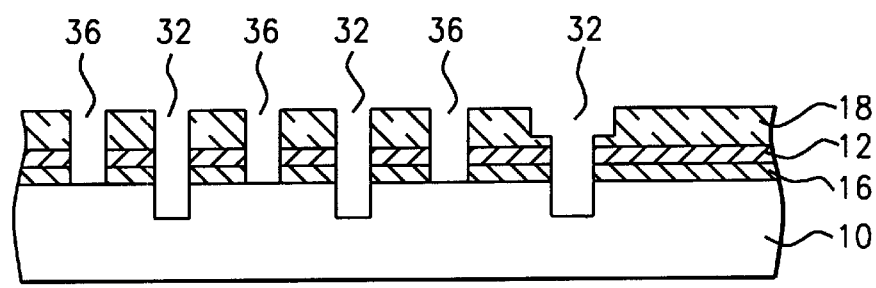
FIG. 18 shows the mask after dry etching of the opaque and attenuating layers.

FIG. 18 shows the results of a dry etch that removes the layers of opaque material (12) and the attenuating material (16) previously exposed in openings (36).

Figure 19:
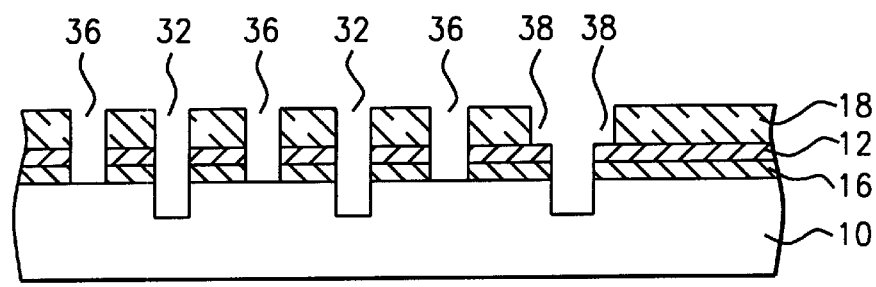
FIG. 19 shows the mask after reducing the resist layer with an oxygen plasma etch.

FIG. 19 shows the result of a final etch by the selective, anisotropic oxygen plasma, etching back the resist layer in the rim region (38), to expose the opaque layer beneath it. A final wet etch of the exposed opaque layer, leaving now the attenuating layer exposed, followed by a removal of the remaining resist, produces the final mask configuration of FIG. 13.

As is understood by a person skilled in the art, the preferred embodiment and examples of the present invention are illustrative of the present invention rather than limiting of it. Revisions and modifications may be made to processes, structures and dimensions through which is fabricated, using a cost effective method, a combined attenuated-alternating phase shift mask in accord with the preferred embodiment and examples of the present invention while still providing such an attenuated-alternating phase shift mask in accord with the present invention and appended claims.

What is claimed is:

1. A method for fabricating a mask combining an attenuating phase shift part and an alternating phase shift part on the same mask blank, comprising:

providing a mask blank comprising a transparent substrate on which has been sequentially deposited a first mask layer and a second mask layer;

depositing on said mask blank a first layer of resist material;

exposing said first layer of resist material with two deposition amounts of exposure energy, wherein a more deeply penetrating amount penetrates to the second mask layer, whereas the less deeply penetrating amount, outlines a shallow rim region;

removing the exposed areas of the first resist layer by developing and baking;

subjecting the exposed second mask layer to a dry etch, removing both the second mask layer and the first mask layer immediately below said second mask layer;

applying a highly selective and anisotropic etch to the surface of the first resist layer, selectively etching down the shallow rim region to expose the second mask layer beneath it;

etching away said second mask layer to expose the first mask layer surrounding the rim region;

removing the remaining first resist layer;

depositing a second resist layer on the mask;

exposing said second resist layer to an exposure intensity sufficient to delineate the portions of the transparent substrate that will not phase shift;

developing and baking the exposed regions of the second resist layer to expose the surface of the transparent substrate below;

subjecting said surface of the optically transparent substrate to a dry etch to a depth of approximately 2700 angstroms below the surface of the substrate;

removing the remaining second resist layer.

2. The method of claim 1 wherein the transparent substrate of the mask blank is an optically transparent substrate.

3. The method of claim 1 wherein the optically transparent substrate of the mask blank is quartz having a thickness of between 4 mm and 6 mm.

4. The method of claim 1 wherein the first mask layer is an attenuating layer.

5. The method of claim 4 wherein the attenuating layer is the optically attenuating material MoSiON deposited to a thickness of between 800 angstroms and 1100 angstroms.

6. The method of claim 4 wherein the attenuating layer is also a phase shifting layer.

7. The method of claim 6 wherein the phase shifting layer is the optically phase shifting material MoSiON, deposited so as to produce a phase shift of between 175° and 185°.

8. The method of claim 1 wherein the second mask layer is a layer of optically opaque material.

9. The method of claim 8 wherein the optically opaque material is chromium deposited to a depth of between 700 angstroms and 1000 angstroms.

10. The method of claim 1 wherein the first resist layer is a resist sensitive to E-beam exposure.

11. The method of claim 1 wherein the exposure energy is E-beam exposure energy.

12. The method of claim 11 wherein the lower amount of E-beam exposure is between 6 $\mu C/cm^2$ and 8 $\mu C/cm^2$ deposited by a 50 kev E-beam.

13. The method of claim 11 wherein the higher amount of E-beam exposure is between 27 $\mu C/cm^2$ and 28 $\mu C/cm^2$ deposited by a 50 kev E-beam.

14. The method of claim 1 wherein the anisotropic etch is an oxygen plasma etch.

15. The method of claim 1 where the second resist layer is sensitive to E-beam exposure.

16. The method of claim 15 wherein the exposure of the second resist layer is an E-beam exposure.

17. The method of claim 16 wherein the E-beam exposure is an exposure of approximately 27 $\mu$C/cm$^2$ deposited by a 50 kev E-beam.

18. The method of claim 1 where the optically transparent substrate is etched to a depth sufficient to produce a 180 degree phase shift of the transmitted light relative to the phase of light transmitted by unetched portions of said substrate.

19. A method for fabricating a mask combining an attenuating phase shift part and an alternating phase shift part on the same mask blank, comprising:

providing a mask blank comprising a transparent substrate on which has been sequentially deposited a first mask layer and a second mask layer;

depositing on said mask blank a first layer of resist material;

exposing said layer of resist material with three intensity levels of exposure energy, wherein the highest intensity level penetrates to the depth of the second mask layer, the least intense level outlines a shallow depth rim region and the intermediate intensity level penetrates to a depth between those two depths;

removing the exposed areas of the first resist layer by developing and baking;

removing the second mask layer exposed by the resist development with a first etch;

applying a second etch to the regions from which the second mask layer has been removed, said etch penetrating the first mask layer and penetrating into the transparent substrate;

applying a highly selective and anisotropic etch to the surface of the resist layer, selectively etching down the regions of the resist layer exposed to the intermediate exposure energy to the depth of the second mask layer;

etching though said second mask layer with a dry etch;

applying a highly selective and anisotropic etch to the surface of the resist layer to etch back the shallow rim region produced by the lowest exposure energy to the depth of the second mask layer;

etching away said second mask layer with a wet etch to the depth of the first mask layer;

removing the remaining resist layer.

20. The method of claim 19 wherein the transparent substrate of the mask blank is an optically transparent substrate.

21. The method of claim 20 wherein the optically transparent substrate of the mask blank is a quartz substrate having a thickness of between 4 mm and 6 mm.

22. The method of claim 19 wherein the first mask layer is an attenuating layer.

23. The method of claim 22 wherein the first mask layer is an optically attenuating layer of MoSiON deposited to a thickness of between 800 angstroms and 1100 angstroms.

24. The method of claim 19 wherein the attenuating layer is also a phase shifting layer.

25. The method of claim 24 wherein the phase shifting layer is the optically phase shifting material MoSiON, deposited so as to produce a phase shift of between 175° and 185°.

26. The method of claim 19 wherein the second layer is a layer of optically opaque material.

27. The method of claim 26 wherein the optically opaque material is chromium deposited to a depth of between 700 angstroms and 1000 angstroms.

28. The method of claim 19 wherein the resist layer is a resist sensitive to E-beam exposure.

29. The method of claim 19 wherein the exposure energy is E-beam exposure energy.

30. The method of claim 29 wherein the lowest amount of E-beam exposure is between 6 $\mu$C/cm$^2$ and 8 $\mu$C/cm$^2$ of a 50 kev E-beam.

31. The method of claim 29 wherein the intermediate amount of E-beam exposure is between 9 $\mu$C/cm$^2$ and 11 $\mu$C/cm$^2$ of a 50 kev E-beam.

32. The method of claim 29 wherein the high amount of E-beam exposure is between 26 $\mu$C/cm$^2$ and 28 $\mu$C/cm$^2$ of a 50 kev E-beam.

33. The method of claim 29 wherein the optically transparent substrate is etched to a depth of 2700 angstroms.

34. The method of claim 29 wherein the optically transparent substrate is etched to a depth sufficient to produce a 180 degree phase shift of the transmitted light relative to the phase of light transmitted by unetched portions of said substrate.

35. The method of claim 29 wherein the selective, anisotropic etch is an oxygen plasma etch.

36. A mask combining an attenuated phase shift part and an alternating phase shift part on the same mask blank, comprising:

a mask blank comprising a transparent substrate on which has been sequentially deposited a first mask layer and a second mask layer;

an alternating phase shift part consisting of regions from which the first and second mask layers have been removed from the transparent substrate and said substrate has been etched to a certain depth;

an attenuated phase shift part consisting of an isolated region from whose center the two mask layers have been removed, having an annular rim region from which only the second mask layer has been removed.

37. The mask of claim 36 in which the transparent substrate is optically transparent quartz of thickness between 4 mm and 6 mm.

38. The mask of claim 36 in which the first mask layer is an optically attenuating layer.

39. The mask of claim 36 in which the optically attenuating layer is MoSiNO of thickness between 800 angstroms and 1100 angstroms.

40. The mask of claim 36 in which the optically attenuating layer is also an optically phase shifting layer of MoSiNO deposited to a depth of 800 angstroms.

41. The mask of claim 36 in which the second mask layer is an optically opaque layer.

42. The mask of claim 36 in which the optically opaque layer is a chromium layer of thickness between 700 angstroms and 1000 angstroms.

* * * * *